(12) United States Patent
Wu et al.

(10) Patent No.: US 10,091,910 B2
(45) Date of Patent: Oct. 2, 2018

(54) SECURING MECHANISM AND ELECTRONIC DEVICE WITH SAME

(71) Applicant: AURAS Technology Co., Ltd., New Taipei (TW)

(72) Inventors: An-Chih Wu, New Taipei (TW);
Mu-Shu Fan, New Taipei (TW);
Hsin-Chang Chen, New Taipei (TW);
Hung-Yi Kuo, New Taipei (TW);
Ming-Chieh Li, New Taipei (TW)

(73) Assignee: AURAS TECHNOLOGY CO., LTD., New Taipei (TW)

(*) Notice: Subject to any disclaimer, the term of this patent is extended or adjusted under 35 U.S.C. 154(b) by 0 days.

(21) Appl. No.: 15/454,091

(22) Filed: Mar. 9, 2017

(65) Prior Publication Data

US 2018/0213682 A1 Jul. 26, 2018

(30) Foreign Application Priority Data

Jan. 25, 2017 (TW) .............................. 106102954 A

(51) Int. Cl.
*H05K 7/20* (2006.01)
*F28F 9/00* (2006.01)
*H01L 23/40* (2006.01)

(52) U.S. Cl.
CPC ........... *H05K 7/2049* (2013.01); *F28F 9/002* (2013.01); *H01L 23/4093* (2013.01); *H01L 2023/405* (2013.01); *H01L 2023/4081* (2013.01)

(58) Field of Classification Search
CPC ... H05K 7/2049; H01L 23/40; H01L 23/4093; H01L 2023/405; H01L 2023/4081; H01L 2023/4087; F28F 9/002

USPC ........................ 165/80.3, 185; 257/718–719; 24/458–459, 520; 411/107, 353; 248/220.21, 222.2, 222.14, 560; 361/704, 361/719

See application file for complete search history.

(56) References Cited

U.S. PATENT DOCUMENTS

| | | | | |
|---|---|---|---|---|
| 6,400,572 B1* | 6/2002 | Wu | ..................... | H01L 23/4093 165/80.3 |
| 6,507,459 B1* | 1/2003 | Kamigama | .......... | G11B 5/4826 360/245.9 |
| 6,754,080 B2* | 6/2004 | Lee | ..................... | H01L 23/4093 24/458 |
| 7,564,689 B1* | 7/2009 | Guo | .................... | H01L 23/4093 165/185 |
| 7,746,646 B2* | 6/2010 | Kuo | .................... | H01L 23/4093 165/185 |

* cited by examiner

*Primary Examiner* — Zachary M Pape
(74) *Attorney, Agent, or Firm* — WPAT, PC

(57) ABSTRACT

A securing mechanism is provided for facilitating attaching a heat dissipation element. The securing mechanism includes a first fixing part, a second fixing part, a first arm and a second arm. The first arm and the second arm are connected with the first fixing part and the second fixing part. A first bent structure is protruded from the first arm and toward the second arm. A second bent structure is protruded from the second arm and toward the first arm. The securing mechanism is fixed on the heat dissipation element through the first fixing part and the second fixing part. The heat dissipation element is pressed by the first bent structure and the second bent structure. Consequently, the heat dissipation element is attached on the heat source.

19 Claims, 10 Drawing Sheets

SECURING MECHANISM AND ELECTRONIC DEVICE WITH SAME

FIELD OF THE INVENTION

The present invention relates to a fixing device, and more particularly to a securing mechanism for an electronic device.

BACKGROUND OF THE INVENTION

Generally, an electronic device comprises heat-generation components such as a processor or a chip. During operation of the electronic device, the heat-generation component generates a great deal of heat. The heat is usually accumulated within the electronic device. If the heat cannot be effectively dissipated away, the temperature within the electronic device is abruptly increased. The increased temperature is detrimental to the operations of the electronic components within the electronic device or results in damage of the electronic components. Conventionally, a securing mechanism is used to fix a heat sink on the processor or the chip. By using the securing mechanism, the heat sink is firmly attached and fixed on the processor or the chip. Consequently, the heat generated by the processor or the chip can be transferred to heat sink and effectively dissipated away.

FIG. 1 is a schematic perspective view illustrating the structure of a conventional securing mechanism. As shown in FIG. 1, the conventional securing mechanism 9 comprises a first engaging element 91, a second engaging element 92 and two parallel arms 93 and 94. The arms 93 and 94 are connected with the first engaging element 91 and the second engaging element 92. The first engaging element 91 and the second engaging element 92 are on two opposite sides of a heat sink (not shown). In addition, the first engaging element 91 and the second engaging element 92 are locked on a heat source (not shown). The arms 93 and 94 are installed on the heat sink. When the first engaging element 91 and the second engaging element 92 are locked on the heat source, the arms 93 and 94 press the heat sink. Consequently, the heat sink is attached on the heat source, and the heat can be effectively transferred to the heat sink. However, the conventional securing mechanism still has some drawbacks. For example, since the arms 93 and 94 are two parallel upstanding long strips, the contact areas between the bottom surfaces of the arms 93, 94 and the heat sink are very small. Since the pressing force exerted on the heat sink is not uniformly distributed, the heat sink cannot be firmly attached on the heat source. Moreover, since the arms 93 and 94 are readily bent and deformed, the fixing function cannot be effectively achieved.

In other words, the conventional technology needs to be further improved.

SUMMARY OF THE INVENTION

For solving the drawbacks of the conventional technology, the present invention provides a securing mechanism for attaching a heat dissipation element on a heat source. Since the pressing force of the securing mechanism exerted on the heat sink is uniformly distributed and the structural strength is enhanced, the heat sink is firmly attached on the heat source and the securing mechanism is not readily suffered from deformation.

In accordance with an aspect of the present invention, there is provided a securing mechanism for facilitating attaching a heat dissipation element. A base is located beside the heat source. The securing mechanism includes a first fixing part, a second fixing part, a first arm and a second arm. The first arm and the second arm are connected with the first fixing part and the second fixing part. A first bent structure is protruded from the first arm and toward the second arm. A second bent structure is protruded from the second arm and toward the first arm. A force-receiving surface is defined by the first bent structure and the second bent structure collaboratively. The securing mechanism is installed on the base through the first fixing part and the second fixing part. The heat dissipation element is pressed by the force-receiving surface of the first bent structure and the second bent structure. Consequently, the heat dissipation element is attached on the heat source.

In an embodiment, the first bent structure is protruded from a lower portion the first arm and toward a lower portion of the second arm, and the second bent structure is protruded from the lower portion of the second arm and toward the lower portion of the first arm.

In an embodiment, the first bent structure and the second bent structure are connected with each other to define the force-receiving surface, and the force-receiving surface is located at a lower portion of the first arm and a lower portion of the second arm to press the heat dissipation element.

In an embodiment, the first arm includes a first front segment, a first intermediate segment and a first rear segment, the second arm includes a second front segment, a second intermediate segment and a second rear segment, the first arm and the second arm are arranged between the first fixing part and the second fixing part, the first front segment and the second front segment are connected with the first fixing part, the first rear segment and the second rear segment are connected with the second fixing part, the first intermediate segment is arranged between the first front segment and the first rear segment, and the second intermediate segment is arranged between the second front segment and the second rear segment. The first bent structure is protruded from the first intermediate segment and toward the second intermediate segment. The second bent structure is protruded from the second intermediate segment and toward the first intermediate segment.

In an embodiment, the first bent structure is longer than the second bent structure, and the first bent structure is partially overlapped with the second bent structure.

In an embodiment, the first bent structure is extended to a region under the second arm, and the second bent structure is extended to a region under the first arm, so that the first bent structure and the second bent structure are stacked on and overlapped with each other.

In an embodiment, the first bent structure further includes an extension frame, and the second bent structure is extended to a region under the extension frame and attached on the extension frame.

In an embodiment, the heat dissipation element is a fin-type heat sink or an integrated heat sink, and the heat source is a chip.

In accordance with another aspect of the present invention, there is provided an electronic device. The electronic device includes a heat source, a base, a heat dissipation element and a securing mechanism. The base is located beside the heat source, and includes a first hook and a second hook. The heat dissipation element is contacted with the heat source and disposed on the base. The securing mechanism is installed on the base, and includes a first fixing part, a second fixing part, a first arm and a second arm. The first fixing part is engaged with the first hook. The second fixing part is engaged with the second hook. The first arm and the second arm are connected with the first fixing part and the second fixing part. A first bent structure is protruded from the first arm and toward the second arm. A second bent structure is protruded from the second arm and toward the first arm. A force-receiving surface is defined by the first bent structure and the second bent structure collaboratively. The securing mechanism is installed on the base through the first fixing part and the second fixing part. The heat dissipation element is pressed by the force-receiving surface of the first bent structure and the second bent structure. Consequently, the heat dissipation element is firmly attached on the heat source.

In an embodiment, the first fixing part of the securing mechanism includes a first opening, and the second fixing part of the securing mechanism includes a second opening. When the first hook of the base is locked into the first opening and the second hook of the base is locked into the second opening, the securing mechanism is installed on the base.

In an embodiment, the securing mechanism further includes an adjustable lever, and the adjustable lever is installed on the second fixing part. When the adjustable lever is in a second position, the heat dissipation element is only slightly contacted with the heat source. When the adjustable lever is in a first position, the second fixing part is pushed by the adjustable lever and moved toward the base, the first arm and the second arm are correspondingly moved with the second fixing part, and the heat dissipation element is pressed by the first bent structure and the second bent structure. Consequently, the heat dissipation element is in firmly attached on the heat source.

In an embodiment, the heat dissipation element includes a groove and a heat conduction block. The first arm and the second arm are disposed within the groove. The heat source is contacted with the heat conduction block.

In an embodiment, the first bent structure is protruded from a lower portion the first arm and toward a lower portion of the second arm, and the second bent structure is protruded from the lower portion of the second arm and toward the lower portion of the first arm.

In an embodiment, the first bent structure and the second bent structure are connected with each other to define the force-receiving surface, and the force-receiving surface is located at a lower portion of the first arm and a lower portion of the second arm to press the heat dissipation element.

In an embodiment, the first arm includes a first front segment, a first intermediate segment and a first rear segment, the second arm includes a second front segment, a second intermediate segment and a second rear segment, the first arm and the second arm are arranged between the first fixing part and the second fixing part, the first front segment and the second front segment are connected with the first fixing part, the first rear segment and the second rear segment are connected with the second fixing part, the first intermediate segment is arranged between the first front segment and the first rear segment, and the second intermediate segment is arranged between the second front segment and the second rear segment. The first bent structure is protruded from the first intermediate segment and toward the second intermediate segment. The second bent structure is protruded from the second intermediate segment and toward the first intermediate segment.

In an embodiment, the first bent structure is longer than the second bent structure, and the first bent structure is partially overlapped with the second bent structure.

In an embodiment, the first bent structure is extended to a region under the second arm, and the second bent structure is extended to a region under the first arm. Consequently, the first bent structure and the second bent structure are stacked on and overlapped with each other.

In an embodiment, the first bent structure further includes an extension frame, and the second bent structure is extended to a region under the extension frame and attached on the extension frame.

In an embodiment, the heat dissipation element is a fin-type heat sink or an integrated heat sink, and the heat source is a chip.

In accordance with a further aspect of the present invention, there is provided a securing mechanism. The securing mechanism includes a first fixing part, a second fixing part, a first arm and a second arm. The first arm and the second arm are connected with the first fixing part and the second fixing part. A force-receiving surface is defined by a lower portion of the first bent structure and a lower portion of the second bent structure collaboratively.

In an embodiment, the first arm includes a first bent structure, and the second arm includes a second bent structure. The first bent structure is protruded from a lower portion the first arm and toward the second arm. The second bent structure is protruded from a lower portion of the second arm and toward the first arm. The first bent structure and the second bent structure are combined together to define the force-receiving surface.

In an embodiment, the first bent structure and the second bent structure are connected with each other by a welding means. After the welded region between the first bent structure and the second bent structure is polished, the force-receiving surface is formed.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments and accompanying drawings.

Figure 1:
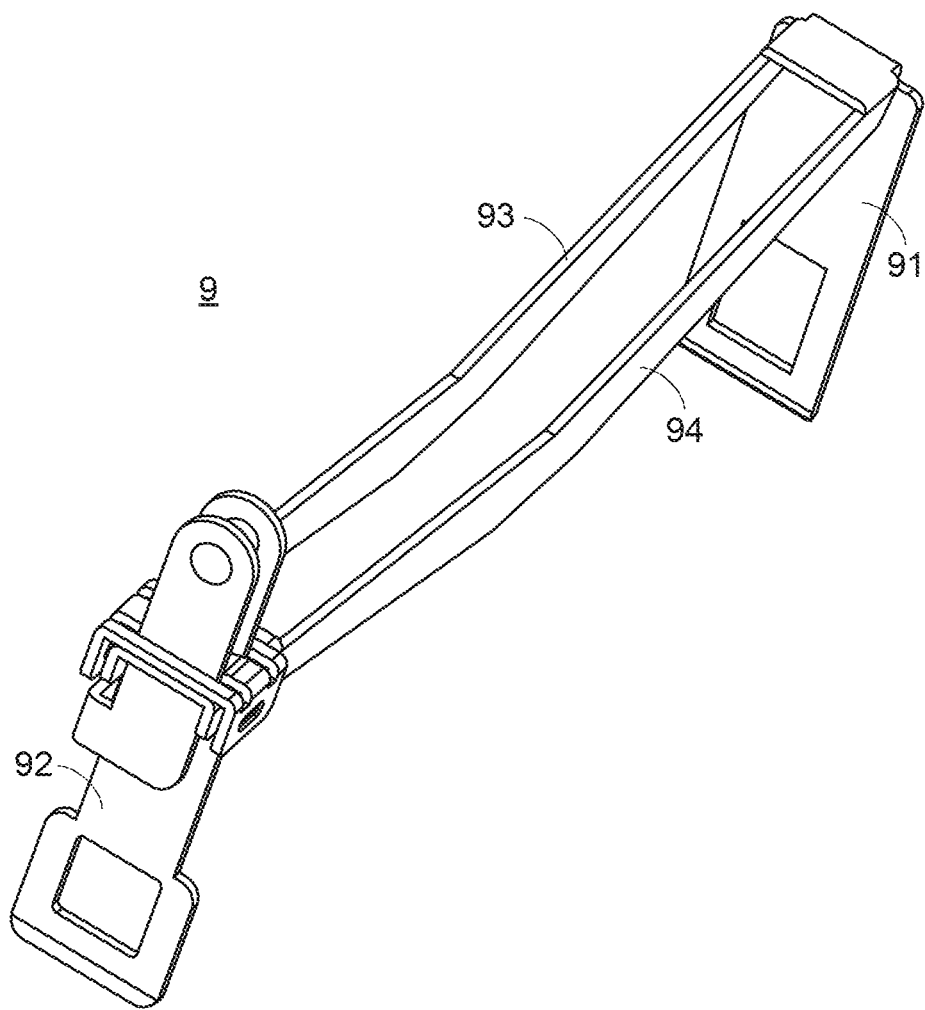
FIG. 1 is a schematic perspective view illustrating the structure of a conventional securing mechanism.
Figure 2:
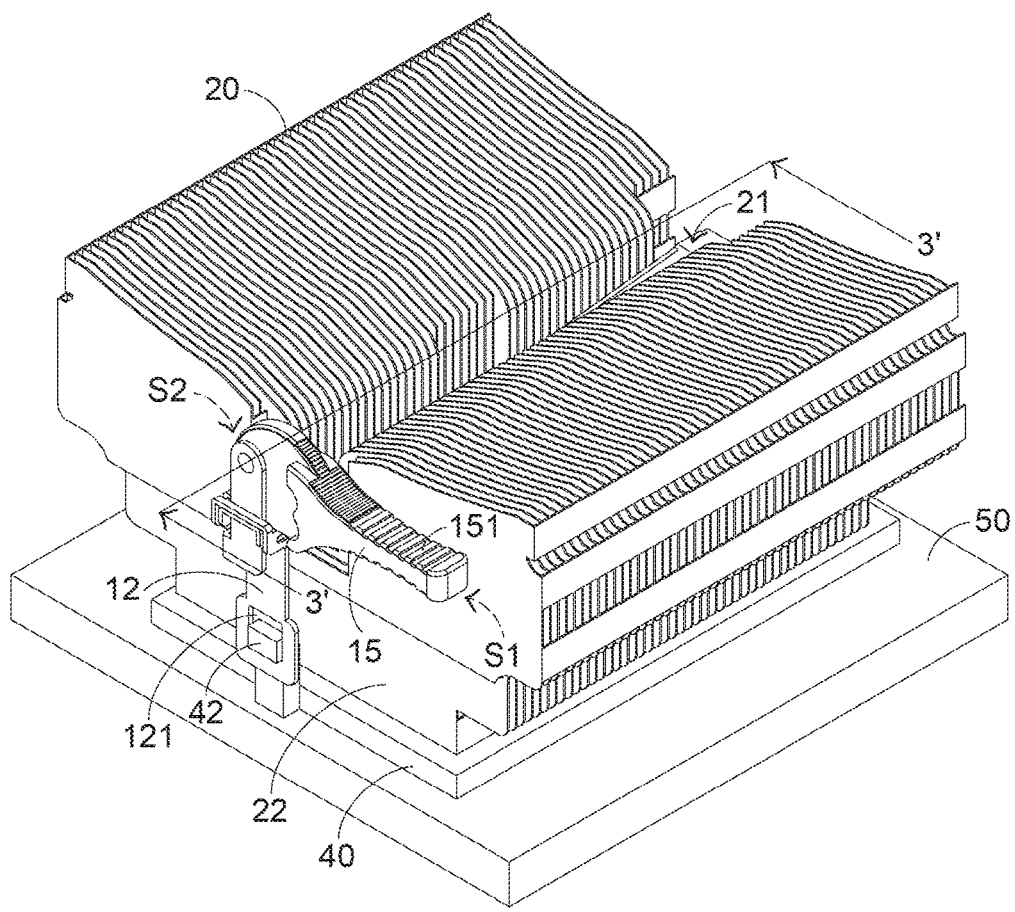
FIG. 2 is a schematic perspective view illustrating an electronic device according to a first embodiment of the present invention.
Figure 3:
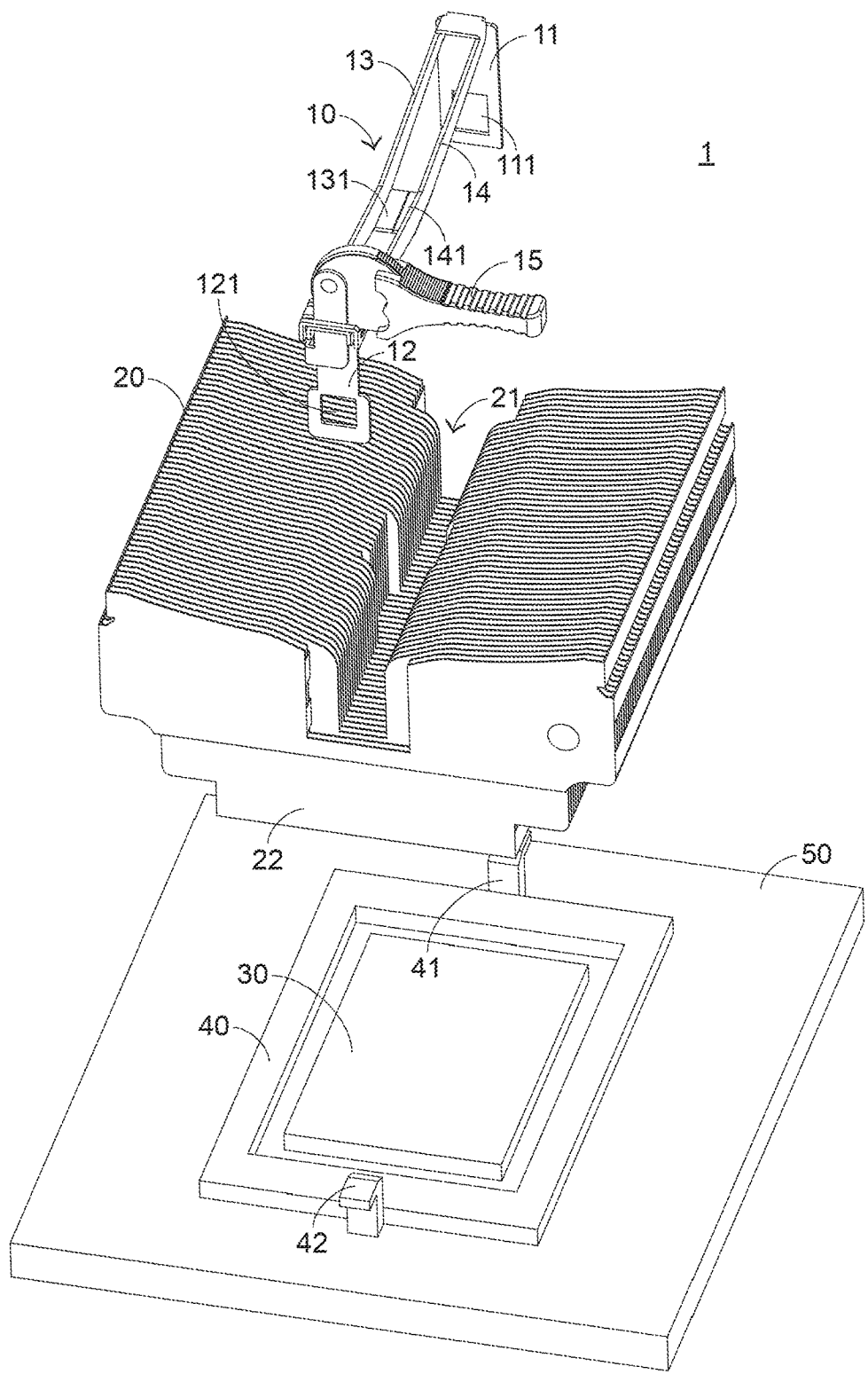
FIG. 3 is a schematic exploded view illustrating the electronic device according to the first embodiment of the present invention.
Figure 8:
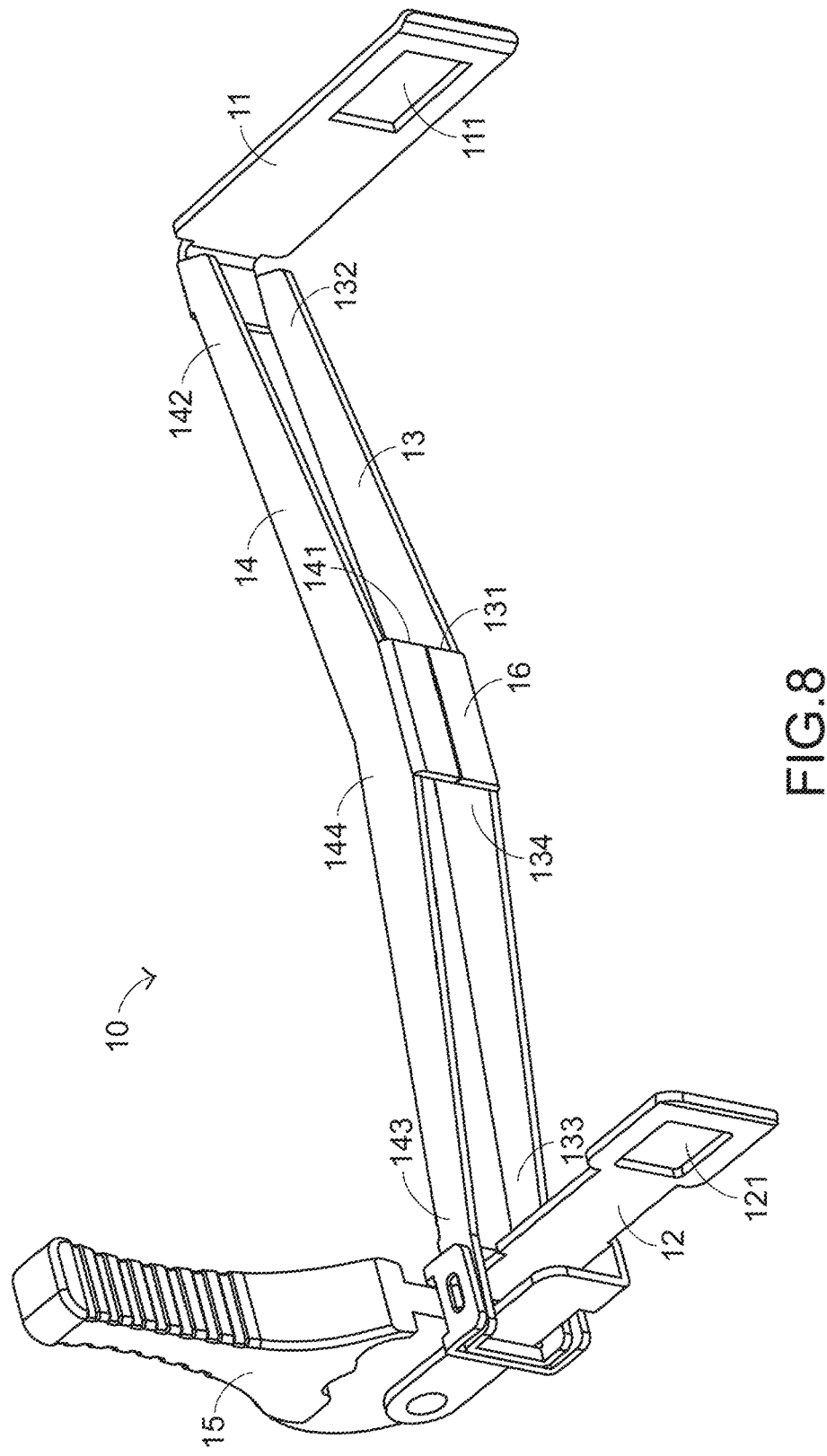
FIG. 8 is a schematic bottom perspective view illustrating the securing mechanism according to the first embodiment of the present invention.

A first embodiment of the present invention will be described as follows. FIG. 2 is a schematic perspective view illustrating an electronic device according to a first embodiment of the present invention. FIG. 3 is a schematic exploded view illustrating the electronic device according to the first embodiment of the present invention. The electronic device 1 is installed on a substrate 50. For example, the substrate 50 is a main board or a circuit board. The electronic device 1 comprises a securing mechanism 10, a heat dissipation element 20, a heat source 30 and a base 40. The securing mechanism 10 comprises a first fixing part 11, a second fixing part 12, a first arm 13, a second arm 14 and an adjustable lever 15. The first fixing part 11 comprises a first opening 111. The second fixing part 12 comprises a second opening 121. The adjustable lever 15 comprises a handle part 151. The first arm 13 and the second arm 14 of the securing mechanism 10 are connected with the first fixing part 11 and the second fixing part 12. The adjustable lever 15 is installed on the second fixing part 12. Moreover, a first bent structure 131 is protruded from the first arm 13 and toward the second arm 14, and a second bent structure 141 is protruded from the second arm 14 and toward the first arm 13. A force-receiving surface 16 as shown in FIG. 8 is defined by the first bent structure 131 and the second bent structure 141 collaboratively. The heat dissipation element 20 comprises a groove 21 and a heat conduction block 22. The base 40 comprises a first hook 41 and a second hook 42.

The heat source 30 is disposed on the substrate 50. The heat dissipation element 20 is disposed on the heat source 30. The heat conduction block 22 of the heat dissipation element 20 is contacted with the heat source 30. The base 40 is disposed on the substrate 50 and arranged around the heat source. The first hook 41 and the second hook 42 of the base 40 are protruded in a direction from the substrate 50 to the heat dissipation element 20. The securing mechanism 10 is disposed over the heat dissipation element 20. The first hook 41 of the base 40 is locked into the first opening 111 of the first fixing part 11 of the securing mechanism 10. The second hook 42 of the base 40 is locked into the second opening 121 of the second fixing part 12 of the securing mechanism 10. Consequently, the securing mechanism 10 is installed on the base 40. The first arm 13 and the second arm 14 are disposed within the groove 21 of the heat dissipation element 20.

When the handle part 151 of the adjustable lever 15 is in a first position S1, the first arm 13 and the second arm 14 are pushed toward the substrate 40 to press the heat dissipation element 20. Meanwhile, the first bent structure 131 and the second bent structure 141 press the heat dissipation element 20, and the force-receiving surface 16 (see FIG. 8) is attached on the heat dissipation element 20. Since the heat dissipation element 20 is pressed toward the heat source 30, the heat dissipation element 20 is firmly attached on the heat source 30. Consequently, the heat generated by the heat source 30 can be effectively transferred through the heat conduction block 22 of the heat dissipation element 20 and dissipated away.

When the handle part 151 of the adjustable lever 15 is in a second position S2, the first arm 13 and the second arm 14 are not pushed by the adjustable lever 15. Since the first arm 13 and the second arm 14 are loosened from the heat dissipation element 20, the heat dissipation element 20 are no pressed by the first arm 13 and the second arm 14. Meanwhile, the force-receiving surface 16 (see FIG. 8) defined by the first bent structure 131 and the second bent structure 141 is not attached on the heat dissipation element 20. Since the heat dissipation element 20 is not pressed by the securing mechanism 10, the heat dissipation element 20 is slightly contacted with the heat source 30 but is not firmly attached on the heat source. Under this circumstance, the heat dissipation element 20 is movable relative to the heat source 30 or detached from the heat source 30.

Figure 4:
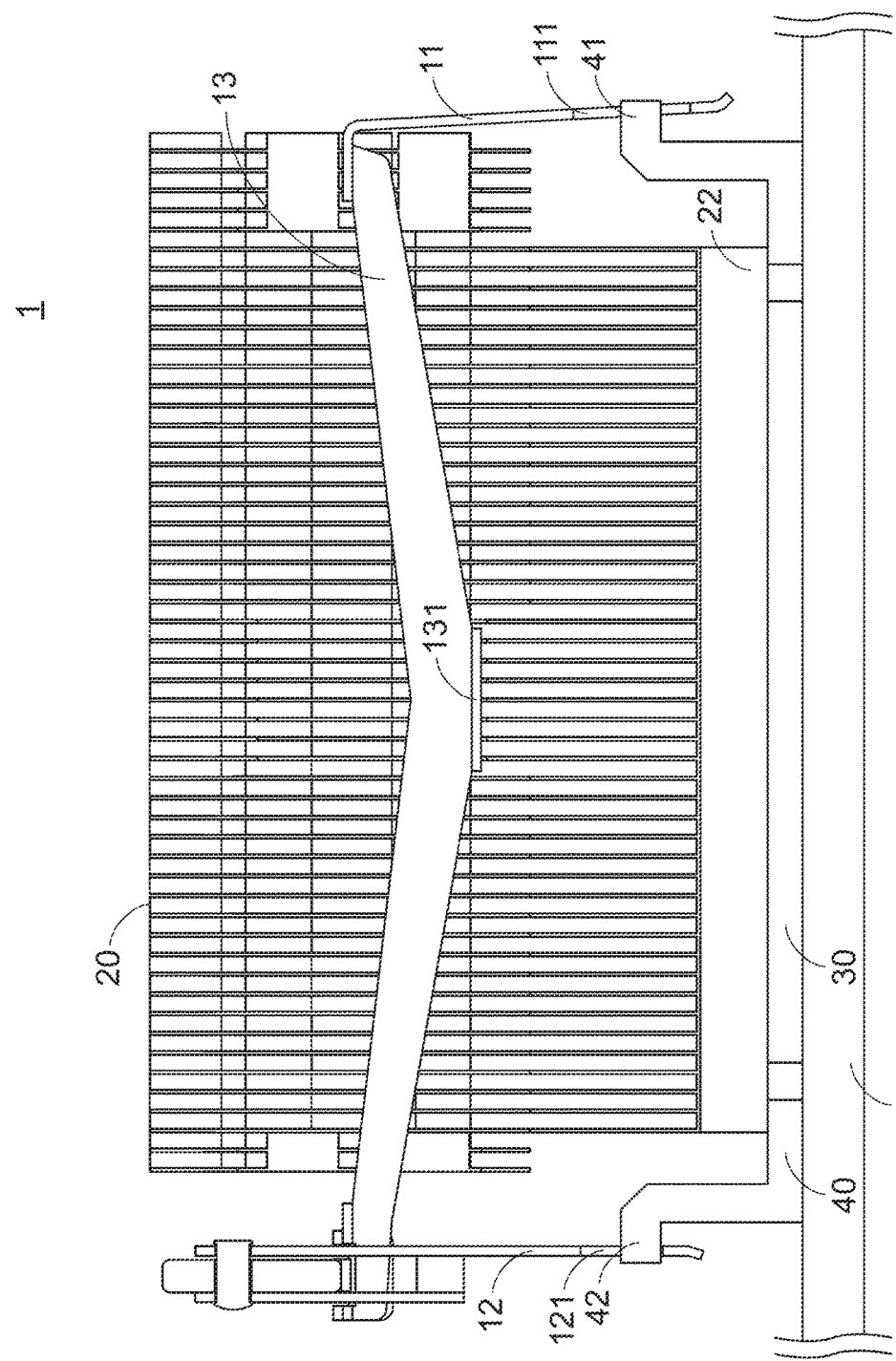
FIG. 4 is a schematic cross-sectional view illustrating the electronic device of FIG. 2 and taken along the line 3'-3'.
Figure 5:
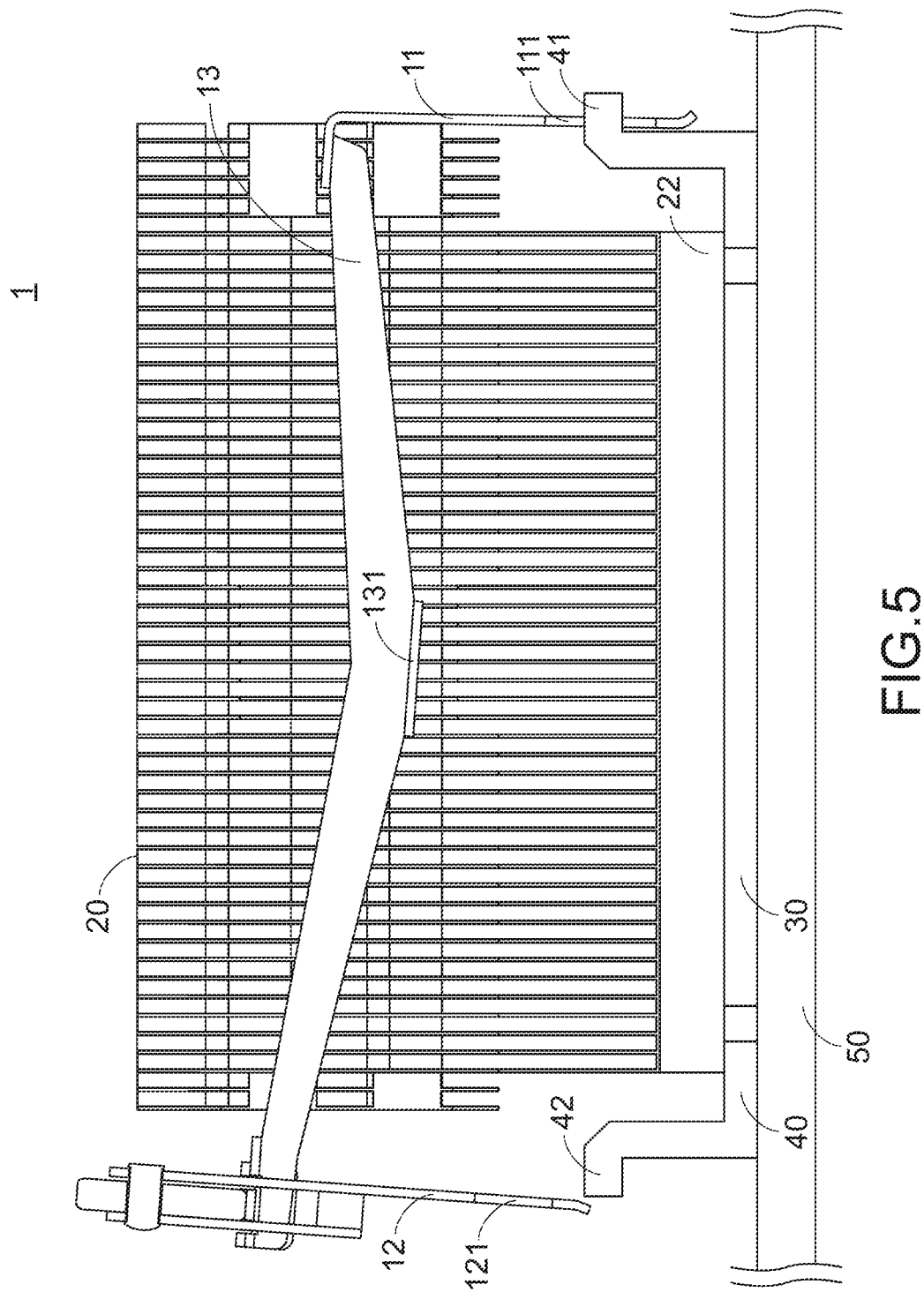
FIG. 5 is a schematic cross-sectional view illustrating the electronic device of FIG. 4, in which the heat dissipation element is not pressed by the securing mechanism.

Hereinafter, the actions of the securing mechanism 10 for pressing the heat dissipation element 20 will be described with reference to FIGS. 4 and 5. FIG. 4 is a schematic cross-sectional view illustrating the electronic device of FIG. 2 and taken along the line 3'-3'. FIG. 5 is a schematic cross-sectional view illustrating the electronic device of FIG. 4, in which the heat dissipation element is not pressed by the securing mechanism. The cross-sectional view of the electronic device of FIG. 2 and taken along the line 3'-3' is shown in FIG. 4. In the cross-sectional view, only a portion of the securing mechanism 10 and a portion of the bent structure are shown. That is, only the first arm 13 and the first bent structure 131 are shown for illustration. In fact, the first arm 13, the second arm 14, the first bent structure 131 and the second bent structure 141 are linked with each other to simultaneously result in actions.

Please refer to FIG. 4 again. When the handle part 151 of the adjustable lever 15 is in the first position S1, the first hook 41 is locked into the first opening 111 the securing mechanism 10. In addition, the second fixing part 12 is pushed by the adjustable lever 15. Consequently, the second hook 42 is locked into the second opening 121. As the second fixing part 12 is moved toward the base 40, the first arm 13 and the second arm 14 are correspondingly moved toward the base 40 to press the heat dissipation element 20. Since the heat dissipation element 20 is pressed by the first bent structure 131 and the second bent structure 141, the heat conduction block 22 of the heat dissipation element 20 is firmly attached on the heat source 30.

Please refer to FIG. 5 again. When the handle part 151 of the adjustable lever 15 is in the second position S2, the first hook 41 is still locked into the first opening 111 the securing mechanism 10. But, the second fixing part 12 is not pushed by the adjustable lever 15. Consequently, the second opening 121 is disengaged from the second hook 42, and the first arm 13 and the second arm 14 are loosened from the heat dissipation element 20. Since the heat dissipation element 20 is not pressed by the first bent structure 131 and the second bent structure 141, the heat conduction block 22 of the heat dissipation element 20 is slightly contacted with the heat source but is not firmly attached on the heat source 30.

Figure 6:
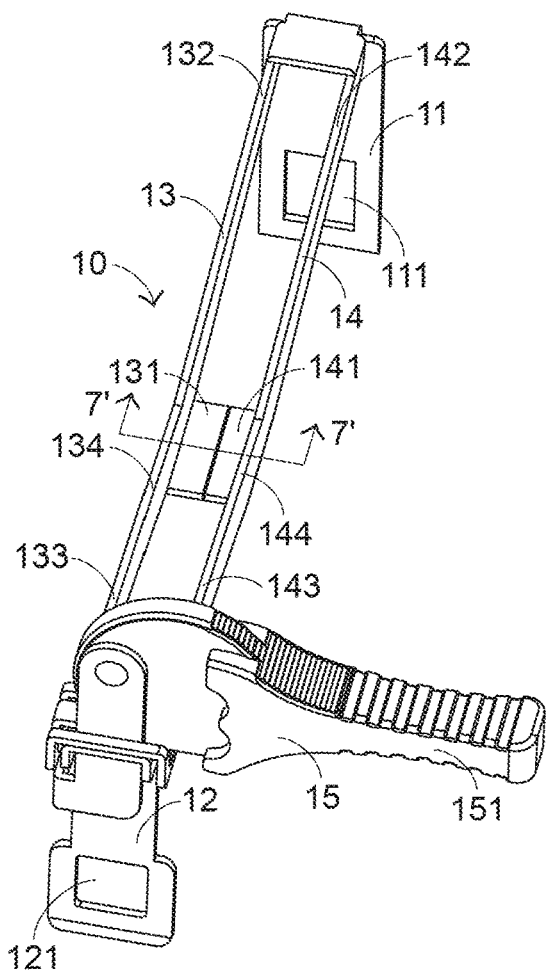
FIG. 6 is a schematic perspective view illustrating the securing mechanism according to the first embodiment of the present invention.
Figure 7:
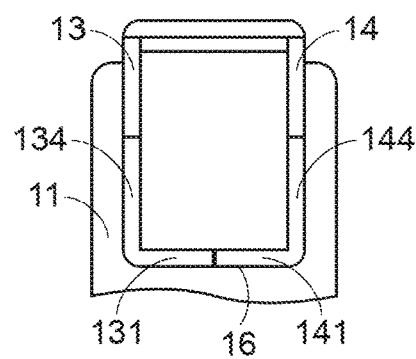
FIG. 7 is a schematic cross-sectional view illustrating the securing mechanism of FIG. 6 and taken along the line 7'-7'.

The securing mechanism 10, the first bent structure 131 and the second bent structure 141 will be described in more details with reference to FIGS. 6, 7 and 8. FIG. 6 is a schematic perspective view illustrating the securing mechanism according to the first embodiment of the present invention. FIG. 7 is a schematic cross-sectional view illustrating the securing mechanism of FIG. 6 and taken along the line 7'-7'. FIG. 8 is a schematic bottom perspective view illustrating the securing mechanism according to the first embodiment of the present invention. The first arm 13 of the securing mechanism 10 comprises a first front segment 132, a first intermediate segment 134 and a first rear segment 133. The second arm 14 of the securing mechanism 10 comprises a second front segment 142, a second intermediate segment 144 and a second rear segment 143. The first arm 13 and the second arm 14 are separated from each other and arranged between the first fixing part 11 and the second fixing part 12. The first front segment 132 of the first arm 13 and the second front segment 142 of the second arm 14 are connected with the first fixing part 11. The first rear segment 133 of the first arm 13 and the second rear segment 143 of the second arm 14 are connected with the second fixing part 12. The first intermediate segment 134 is arranged between the first front segment 132 and the first rear segment 133. The second intermediate segment 144 is arranged between the second front segment 142 and the second rear segment 143. The first bent structure 131 of the securing mechanism 10 is protruded from a lower portion of the first intermediate segment 134 of the first arm 13 and toward a lower portion of the second intermediate segment 144 of the second arm 14. The second bent structure 141 is protruded from the lower portion of the second intermediate segment 144 and toward the lower portion of the first intermediate segment 134 of the first arm 13. The force-receiving surface 16 is defined by the first bent structure 131 and the second bent structure 141 collaboratively. The force-receiving surface 16 is located at the lower portion of the first arm 13 and the lower portion of the second arm 14. Preferably, the first bent structure 131 and the second bent structure 141 are connected with each other by a welding means. After the welded region between the first bent structure 131 and the second bent structure 141 is polished, the force-receiving surface 16 is formed.

Figure 9:
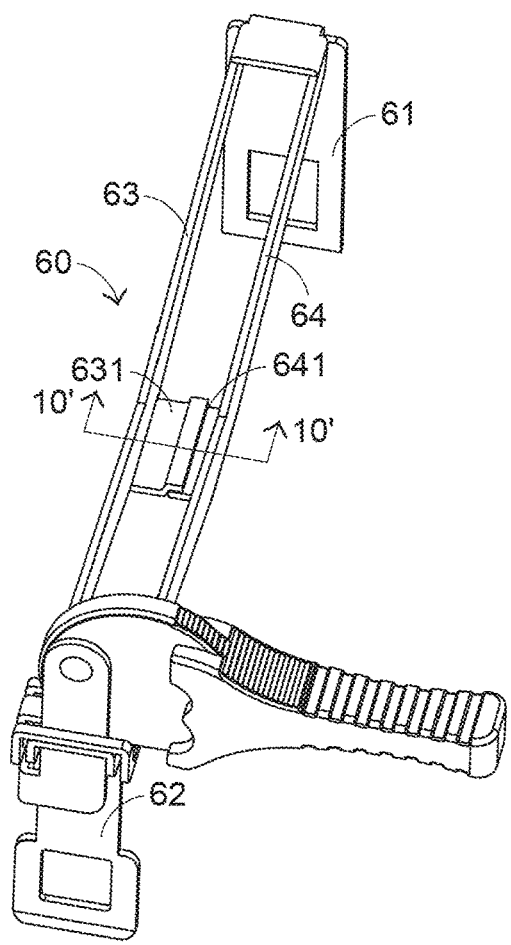
FIG. 9 is a schematic perspective view illustrating a securing mechanism according to a second embodiment of the present invention.
Figure 10:
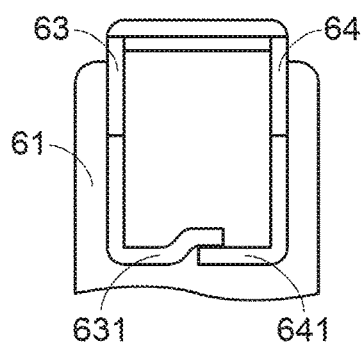
FIG. 10 is a schematic cross-sectional view illustrating the securing mechanism of FIG. 9 and taken along the line 10'-10'.

A securing mechanism 60 of a second embodiment will be illustrated as follows. FIG. 9 is a schematic perspective view illustrating a securing mechanism according to a second embodiment of the present invention. FIG. 10 is a schematic cross-sectional view illustrating the securing mechanism of FIG. 9 and taken along the line 10'-10'. The structures of the components of the second embodiment that are similar to those of the first embodiment are not redundantly described herein. In this embodiment, the securing mechanism 60 comprises a first fixing part 61, a second fixing part 62, a first arm 63 and a second arm 64. The first arm 63 and the second arm 64 are separated from each other and connected with the first fixing part 61 and the second fixing part 62. Moreover, a first bent structure 631 is protruded from a lower portion of the first arm 63 and toward a lower portion of the second arm 64, and a second bent structure 641 is protruded from the lower portion of the second arm 64 and toward the lower portion of the first arm 63. In this embodiment, the first bent structure 631 is longer than the second bent structure 641, and the first bent structure 631 is partially overlapped with the second bent structure 641.

Figure 11:
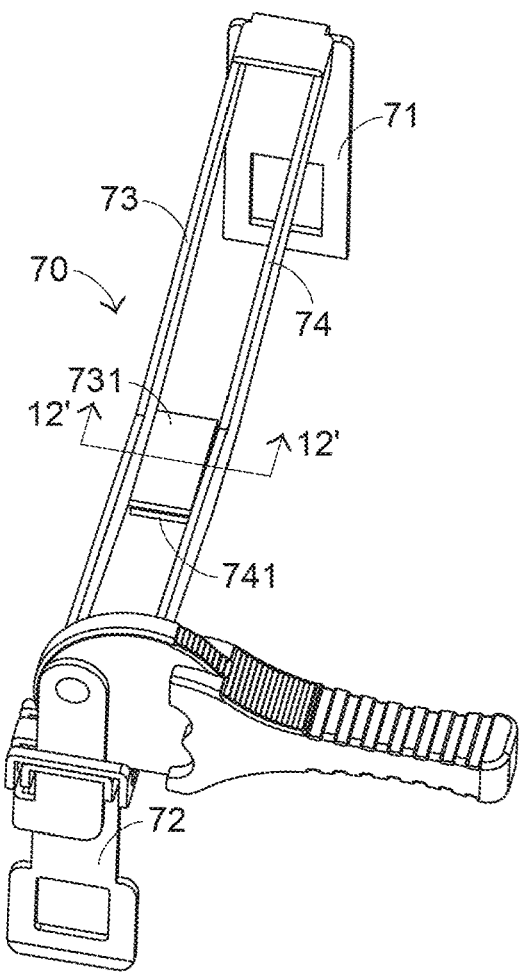
FIG. 11 is a schematic perspective view illustrating a securing mechanism according to a third embodiment of the present invention.
Figure 12:
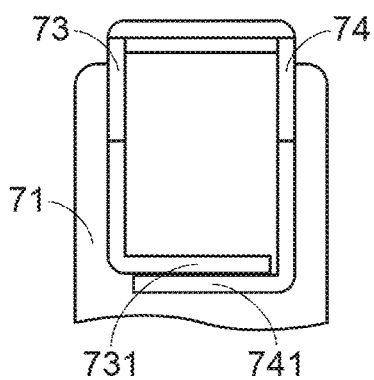
FIG. 12 is a schematic cross-sectional view illustrating the securing mechanism of FIG. 11 and taken along the line 12'-12'.

A securing mechanism 70 of a third embodiment will be illustrated as follows. FIG. 11 is a schematic perspective view illustrating a securing mechanism according to a third embodiment of the present invention. FIG. 12 is a schematic cross-sectional view illustrating the securing mechanism of FIG. 11 and taken along the line 12'-12'. The structures of the components of the third embodiment that are similar to those of the first embodiment are not redundantly described herein. In this embodiment, the securing mechanism 70 comprises a first fixing part 71, a second fixing part 72, a first arm 73 and a second arm 74. The first arm 73 and the second arm 74 are separated from each other and connected with the first fixing part 71 and the second fixing part 72. Moreover, a first bent structure 731 is protruded from a lower portion of the first arm 73 and toward a lower portion of the second arm 74, and a second bent structure 741 is protruded from the lower portion of the second arm 74 and toward the lower portion of the first arm 73. In this embodiment, the first bent structure 731 is extended to a region under the second arm 74, and the second bent structure 741 is extended to a region under the first arm 73. Consequently, the first bent structure 731 and the second bent structure 741 are stacked on and overlapped with each other.

Figure 13:
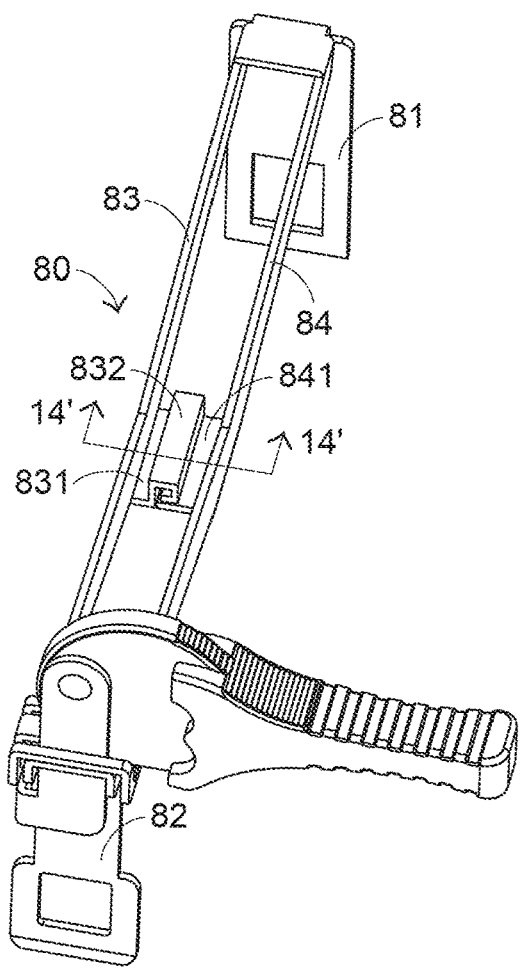
FIG. 13 is a schematic perspective view illustrating a securing mechanism according to a fourth embodiment of the present invention.
Figure 14:
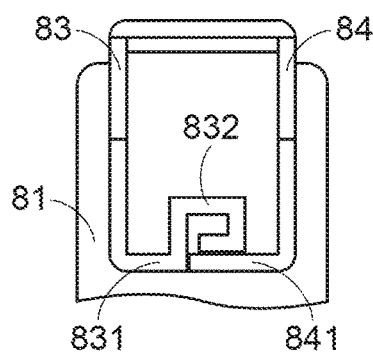
FIG. 14 is a schematic cross-sectional view illustrating the securing mechanism of FIG. 13 and taken along the line 12'-12'.

A securing mechanism 80 of a third embodiment will be illustrated as follows. FIG. 13 is a schematic perspective view illustrating a securing mechanism according to a fourth embodiment of the present invention. FIG. 14 is a schematic cross-sectional view illustrating the securing mechanism of FIG. 13 and taken along the line 12'-12'. The structures of the components of the fourth embodiment that are similar to those of the first embodiment are not redundantly described herein. In this embodiment, the securing mechanism 80 comprises a first fixing part 81, a second fixing part 82, a first arm 83 and a second arm 84. The first arm 83 and the second arm 84 are separated from each other and connected with the first fixing part 81 and the second fixing part 82. A first bent structure 831 is protruded from a lower portion of the first arm 83 and toward a lower portion of the second arm 84. The first bent structure 831 further comprises an extension frame 832. The extension frame 832 is arranged between the first arm 83 and the second arm 84. A second bent structure 841 is protruded from the lower portion of the second arm 84 and toward the lower portion the first arm 83. Moreover, the second bent structure 841 is extended to a region under the extension frame 832, and the second bent structure 841 is attached on the extension frame 832.

The heat dissipation element 20 used in the electronic device of the present invention is a fin-type heat sink or an integrated heat sink. In the above embodiments and drawings, the fin-type heat sink is taken as an example of the heat dissipation element 20. Moreover, the heat source 30 is a chip.

From the above descriptions, the present invention provides a securing mechanism. Since the securing mechanism has enhanced structural strength, the securing mechanism is not readily suffered from deformation. During operations, the pressing force of the securing mechanism exerted on the heat sink is uniformly distributed. Consequently, the drawbacks of the conventional technology will be overcome.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A securing mechanism adapted to be mounted onto a base beside a heat source for attaching a heat dissipation element onto the heat source, the securing mechanism comprising:

a first fixing part;

a second fixing part; and a first arm and a second arm connected with the first fixing part and the second fixing part, wherein a first bent structure is protruded from the first arm and extends toward the second arm, a second bent structure is protruded from the second arm and extends toward the first arm, and the first bent structure and the second bent structure connect or overlap with each other between the first arm and the second arm to define a force-receiving surface collaboratively, wherein when the first fixing part and the second fixing part are mounted to the base, the heat dissipation element is pressed by the force-receiving surface collaboratively defined by the first bent structure and the second bent structure to be attached onto the heat source.

2. The securing mechanism according to claim 1, wherein the first bent structure is protruded from a lower portion the first arm and toward a lower portion of the second arm, and the second bent structure is protruded from the lower portion of the second arm and toward the lower portion of the first arm.

3. The securing mechanism according to claim 1, wherein the first bent structure and the second bent structure are connected with each other to define the force-receiving surface, and the force-receiving surface is located at a lower portion of the first arm and a lower portion of the second arm to press the heat dissipation element.

4. The securing mechanism according to claim 1, wherein the first arm comprises a first front segment, a first intermediate segment and a first rear segment, the second arm comprises a second front segment, a second intermediate segment and a second rear segment, the first arm and the second arm are arranged between the first fixing part and the second fixing part, the first front segment and the second front segment are connected with the first fixing part, the first rear segment and the second rear segment are connected with the second fixing part, the first intermediate segment is arranged between the first front segment and the first rear segment, and the second intermediate segment is arranged between the second front segment and the second rear segment, wherein the first bent structure is protruded from the first intermediate segment and toward the second intermediate segment, and the second bent structure is protruded from the second intermediate segment and toward the first intermediate segment.

5. The securing mechanism according to claim 1, wherein the first bent structure is longer than the second bent structure, and the first bent structure is partially overlapped with the second bent structure.

6. The securing mechanism according to claim 1, wherein the first bent structure is extended to a region under the second arm, and the second bent structure is extended to a region under the first arm, so that the first bent structure and the second bent structure are stacked on and overlapped with each other.

7. The securing mechanism according to claim 1, wherein the first bent structure further comprises an extension frame, and the second bent structure is extended to a region under the extension frame and attached on the extension frame.

8. The securing mechanism according to claim 1, wherein the heat dissipation element is a fin-type heat sink or an integrated heat sink, and the heat source is a chip.

9. An electronic device, comprising:

a heat source;

a base located beside the heat source, and comprising a first hook and a second hook;

a heat dissipation element disposed on the heat source; and a securing mechanism installed on the base, and comprising a first fixing part, a second fixing part, a first arm and a second arm, wherein the first fixing part is engaged with the first hook, the second fixing part is engaged with the second hook, the first arm and the second arm are connected with the first fixing part and the second fixing part, a first bent structure is protruded from the first arm and extends toward the second arm, a second bent structure is protruded from the second arm and extends toward the first arm, the first bent structure and the second bent structure connect or overlap with each other between the first arm and the second arm to define a force-receiving surface collaboratively, wherein the securing mechanism is installed on the base through the first fixing part and the second fixing part, and the heat dissipation element is pressed by the force-receiving surface collaboratively defined by the first bent structure and the second bent structure to be attached on the heat source.

10. The electronic device according to claim 9, wherein the first fixing part of the securing mechanism comprises a first opening, and the second fixing part of the securing mechanism comprises a second opening, wherein when the first hook of the base is locked into the first opening and the second hook of the base is locked into the second opening, the securing mechanism is installed on the base.

11. The electronic device according to claim 9, wherein the securing mechanism further comprises an adjustable lever, and the adjustable lever is installed on the second fixing part, wherein when the adjustable lever is in a second position, the heat dissipation element is only slightly contacted with the heat source, wherein when the adjustable lever is in a first position, the second fixing part is pushed by the adjustable lever and moved toward the base, the first arm and the second arm are correspondingly moved with the second fixing part, and the heat dissipation element is pressed by the first bent structure and the second bent structure, so that the heat dissipation element is in firmly attached on the heat source.

12. The electronic device according to claim 9, wherein the heat dissipation element comprises a groove and a heat conduction block, wherein the first arm and the second arm are disposed within the groove, and the heat source is contacted with the heat conduction block.

13. The electronic device according to claim 9, wherein the first bent structure is protruded from a lower portion the first arm and toward a lower portion of the second arm, and the second bent structure is protruded from the lower portion of the second arm and toward the lower portion of the first arm.

14. The electronic device according to claim 9, wherein the first bent structure and the second bent structure are connected with each other to define the force-receiving surface, and the force-receiving surface is located at a lower portion of the first arm and a lower portion of the second arm to press the heat dissipation element.

15. The electronic device according to claim 9, wherein the first arm comprises a first front segment, a first intermediate segment and a first rear segment, the second arm comprises a second front segment, a second intermediate segment and a second rear segment, the first arm and the second arm are arranged between the first fixing part and the second fixing part, the first front segment and the second front segment are connected with the first fixing part, the first rear segment and the second rear segment are connected with the second fixing part, the first intermediate segment is arranged between the first front segment and the first rear segment, and the second intermediate segment is arranged between the second front segment and the second rear segment, wherein the first bent structure is protruded from the first intermediate segment and toward the second intermediate segment, and the second bent structure is protruded from the second intermediate segment and toward the first intermediate segment.

16. The electronic device according to claim 9, wherein the first bent structure is longer than the second bent structure, and the first bent structure is partially overlapped with the second bent structure.

17. The electronic device according to claim 9, wherein the first bent structure is extended to a region under the second arm, and the second bent structure is extended to a region under the first arm, so that the first bent structure and the second bent structure are stacked on and overlapped with each other.

18. The electronic device according to claim 9, wherein the first bent structure further comprises an extension frame, and the second bent structure is extended to a region under the extension frame and attached on the extension frame.

19. The electronic device according to claim 9, wherein the heat dissipation element is a fin-type heat sink or an integrated heat sink, and the heat source is a chip.

* * * * *